United States Patent
Shimizu et al.

(10) Patent No.: US 6,921,556 B2
(45) Date of Patent: Jul. 26, 2005

(54) METHOD OF FILM DEPOSITION USING SINGLE-WAFER-PROCESSING TYPE CVD

(75) Inventors: Akira Shimizu, Tama (JP); Hideaki Fukuda, Tama (JP); Baiei Kawano, Tama (JP); Kazuo Sato, Tama (JP)

(73) Assignee: ASM Japan K.K., Tokyo (JP)

( * ) Notice: Subject to any disclaimer, the term of this patent is extended or adjusted under 35 U.S.C. 154(b) by 107 days.

(21) Appl. No.: 10/403,179

(22) Filed: Mar. 28, 2003

(65) Prior Publication Data

US 2004/0071874 A1 Apr. 15, 2004

Related U.S. Application Data

(60) Provisional application No. 60/372,624, filed on Apr. 12, 2002.

(51) Int. Cl.[7] .............................................. C23C 16/00
(52) U.S. Cl. ............................... 427/248.1; 427/255.11
(58) Field of Search ......................... 427/248.1, 255.11

(56) References Cited

U.S. PATENT DOCUMENTS

| | | | | |
|---|---|---|---|---|
| 4,854,263 A | | 8/1989 | Chang et al. | |
| 5,370,739 A | * | 12/1994 | Foster et al. | 118/725 |
| 5,902,088 A | * | 5/1999 | Fairbairn et al. | 414/217 |
| 6,174,377 B1 | * | 1/2001 | Doering et al. | 118/729 |
| 6,301,434 B1 | * | 10/2001 | McDiarmid et al. | 392/416 |
| 6,331,212 B1 | * | 12/2001 | Mezey, Sr. | 118/725 |
| 6,524,955 B2 | * | 2/2003 | Fukuda et al. | 438/680 |
| 6,630,053 B2 | * | 10/2003 | Yamagishi et al. | 156/345.32 |
| 2001/0025600 A1 | | 10/2001 | Ikeda et al. | |
| 2002/0034862 A1 | | 3/2002 | Wada et al. | |
| 2002/0036065 A1 | | 3/2002 | Yamagishi et al. | |

* cited by examiner

*Primary Examiner*—Bret Chen
(74) *Attorney, Agent, or Firm*—Knobbe Martens Olson & Bear, LLP

(57) ABSTRACT

A method of film deposition using a single-wafer-processing type CVD apparatus includes: (a) sealing a periphery of a susceptor to separate a reaction chamber from a wafer-handling chamber when the susceptor rises; and (b) flowing a gas from the wafer-handling chamber into the reaction chamber through at least one discharge hole formed through the susceptor via a back side and a periphery of a wafer placed on the susceptor during film deposition.

11 Claims, 5 Drawing Sheets

METHOD OF FILM DEPOSITION USING SINGLE-WAFER-PROCESSING TYPE CVD

This application claims the benefit of U.S. Provisional Application No. 60/372,624, filed Apr. 12, 2002.

BACKGROUND OF THE INVENTION

1. Field of the Invention

The present invention relates to single-wafer-processing type CVD (Chemical Vapor Deposition) which forms a thin film on a semiconductor wafer, which is an object-to-be-processed.

2. Description of the Related Art

Due to high integration of a semiconductor apparatus, interconnects using Cu, which has lower electrical resistance than Al interconnects which were used in the past, have come into use. Additionally, when Cu is used for interconnects, it becomes necessary to form a metal film such as TiN, TaN, etc., which had not conventionally been used before, as a barrier metal for preventing diffusion of Cu. In the present circumstances, sputtering is the favored deposition method of forming these barrier metal films. In the case of Cu interconnects, after a seed layer of a thin film is formed by sputtering, Cu is deposited by plating. In the future, however, further advance of high integration is inevitable, and deposition by CVD which has better step coverage than PVD (Physical Vapor Deposition or sputtering) will become important. If a metal film whose effects on these metal films or a semiconductor apparatus have not been known is deposited using a conventional CVD apparatus, contamination of semiconductor production lines is likely to be caused by metal contamination of the back side or an edge of objects-to-be-processed, lowering yield. To solve such problems, a special apparatus for cleaning the back side and the edge of wafers conventionally had become required. For this reason, a method of suppressing deposition of the back side and the edge by mechanically clamping the edge of semiconductor wafers has been used. This method creates a different set of problems such as damaging semiconductor wafers and generating particles. Additionally, with these metal films, because conventional methods cannot be used for cleaning inside a deposition apparatus, it is critical not to accumulate the metals inside a reaction chamber as much as possible to improve throughput.

SUMMARY OF THE INVENTION

To solve the above-mentioned problems, the apparatus which is an embodiment of the present invention comprises the following means:

A single-wafer-processing type CVD apparatus for forming a film on a semiconductor wafer, comprising: (a) a reaction chamber comprising: (i) a susceptor disposed therein for placing and heating a wafer, wherein at least one gas discharge hole is provided in the susceptor to flow a gas into the reaction chamber via a back side and a periphery of the wafer into the reaction chamber, said susceptor being movable vertically; (ii) a showerhead disposed inside the reaction chamber opposed to and parallel to the susceptor for emitting a jet of reaction gas toward the wafer; (iii) an exhaust duct positioned in the vicinity of the showerhead and provided circularly along a inner wall of the reaction chamber; and (iv) a circular separation plate provided coaxially with the exhaust duct to form a clearance with a bottom of the exhaust duct, said separation plate having a sealing portion to seal a periphery of the susceptor when the susceptor rises, thereby separating the reaction chamber from a wafer-handling chamber configured to be disposed under the reaction chamber; and (b) a temperature-controlling apparatus for regulating the temperature of the showerhead at a given temperature.

According to an embodiment, a sealing portion is formed with an O-ring. Additionally, the above-mentioned apparatus further can comprise a circular guard ring which is disposed for covering a non-deposition area at the periphery of an object-to-be-processed (a substrate or a wafer) along the inner circumference of the separation plate. The circular guard ring is provided at an inner circumference portion of the separation plate, and it can be disposed in such a way that gas flowing out from the gas discharge hole(s) can flow out through a clearance between the guard ring and the wafer into the reaction chamber. Additionally, a clearance between the separation plate and the bottom of the exhaust duct may be adjusted within the range of about 0.1 mm to about 5 mm (other ranges and preferable ranges will be described later) by changing the thickness of the separation plate. According to an embodiment, a temperature-controlled given temperature is within the range of about 50° C. to about 400° C. (other ranges and preferable ranges will be described later). The guard ring can be disposed in such a way as to cover a non-deposition area of the periphery of the object-to-be-processed which is a circular area from the wafer edge to about 0.5 mm to about 3 mm inward (other ranges and preferable ranges will be described later). The temperature controlling mechanism comprises one or more heating means disposed in the vicinity of the showerhead, one or more cooling means disposed in the vicinity of the showerhead, a temperature-measuring means, and a temperature-controlling means which is connected to the heating means, the cooling means and the temperature measuring means. Furthermore, the apparatus can comprise a pressure-measuring means during deposition, which determines a pressure in the vicinity of the object-to-be-processed by measuring a pressure inside the exhaust duct by means of a calculation using a clearance between the separation plate and the susceptor and a flow rate of gas as parameters.

From the viewpoint of the susceptor construction, which may have a multiple number of wafer lift pins and in which the holes of wafer lift pins are used for gas discharge holes, gas discharge from the susceptor can be achieved easily. Gas discharge holes are not limited to the wafer lift pin holes, holes provided in the susceptor other than the gas discharge hoes can serve as the gas discharge holes.

According to another embodiment, in the above-mentioned apparatus, gas discharge holes are provided in the susceptor and can be also provided outside a position of placing the object-to-be-processed to make gas flow out into the reaction chamber through the periphery of the object-to-be-processed during deposition. In this case, a circumference portion on the inside of the sealing means of the separation plate bottom can be disposed in such a position that covers the gas discharge holes. This apparatus may further comprise a circular guard ring disposed for covering a non-deposition area at the periphery of the object-to-be-processed along the inner circumference of the separation plate. The circular guard ring can be disposed at the inner circumference portion of the separation plate in such a way that gas flowing out from the gas discharge holes can flow out into the reaction chamber through a clearance between the guard ring and the wafer. In the above-mentioned embodiment, gas discharging from the gas discharge hole(s) is discharged not passing through the back side of the object-to-be-processed but to an overlapping portion with the separation plate, and flows out into the reaction chamber through the wafer periphery. Also in this embodiment, deposition onto unnecessary portions can be effectively prevented.

The present invention can be effectively applied to a deposition method. In other words, according to one embodiment according to the present invention, a method of film deposition comprises the steps of: (a) placing a wafer on a susceptor positioned inside a wafer-handling chamber disposed under a reaction chamber included in a single-wafer-processing type CVD apparatus; (b) positioning the wafer inside the reaction chamber by raising the susceptor; (c) when the susceptor moves to the position, separating the reaction chamber and the wafer-handling chamber by making closely in contact a periphery of the susceptor and a circular separation plate disposed coaxially with the susceptor and between the reaction chamber and the wafer-handling chamber; (d) emitting a jet of reaction gas from a showerhead disposed inside the reaction chamber onto the wafer to be processed; (e) depositing a film on the wafer; (f) during the deposition, discharging an inert gas from the wafer-handling chamber to the reaction chamber through at least one gas discharge hole formed through the susceptor from its bottom to its top, and via a back side of the wafer placed on the susceptor and a periphery of the wafer; (g) evacuating the reaction chamber through an exhaust duct, which is positioned in the vicinity of the showerhead and is provided circularly along an inner wall of the reaction chamber; and (h) after the deposition, lowering the susceptor and moving the wafer to the wafer-handling chamber.

The above-mentioned method can include a process of covering a non-deposition area at a wafer periphery by a circular guard ring during deposition. Additionally, the guard ring may be disposed at the inner circumference portion of the separation plate so that inert gas can be discharged to the reaction chamber through the back side of the wafer, the wafer periphery, and a clearance between the circular guard ring and the wafer. Furthermore, the susceptor may comprise a multiple number of wafer lift pins which can be used as gas discharge holes. When the susceptor rises, the wafer is positioned inside the reaction chamber and the reaction chamber and the wafer-handling chamber are separated, the inner circumstance portion of the guard ring can be contacted with the wafer periphery. Additionally, exhaustion can be performed through a clearance formed between the exhaust duct and the separation plate. The clearance, according to an embodiment, can be adjusted within the range of about 0.1 mm to about 5 mm (see the other ranges above) by changing the thickness of the separation plate. Deposition can be performed at a temperature within the range of about 50° C. to about 400° C. (including 100° C., 150° C., 200° C., 300° C., and a range including any of the foregoing). Furthermore, a pressure during deposition can be determined by measuring a pressure inside the exhaust duct by means of a calculation using a clearance between the separation plate and the susceptor and a flow rate of reaction gas as parameters.

As described in the above, according to another embodiment, in the above-mentioned method, in the process of discharging an inert gas, an inert gas can be discharged during deposition passing through at least one gas discharge hole, which is provided in the susceptor passing right through from the bottom to the top of the susceptor, from the wafer-handling chamber via a periphery of the wafer placed on the susceptor and an inner circumference end of the separation plate into the reaction chamber. In this case, by disposing a circular guard ring at an inner circumference portion of the separation plate, an inert gas can be discharged into the reaction chamber through the wafer periphery and a clearance between the circular guard ring and the wafer. Because the gas is emitted into the reaction chamber through the wafer periphery according to an embodiment without emitting the gas to the back side of the wafer, deposition onto unnecessary portions such as the back side of the wafer, etc. can be effectively prevented.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Figure 1:
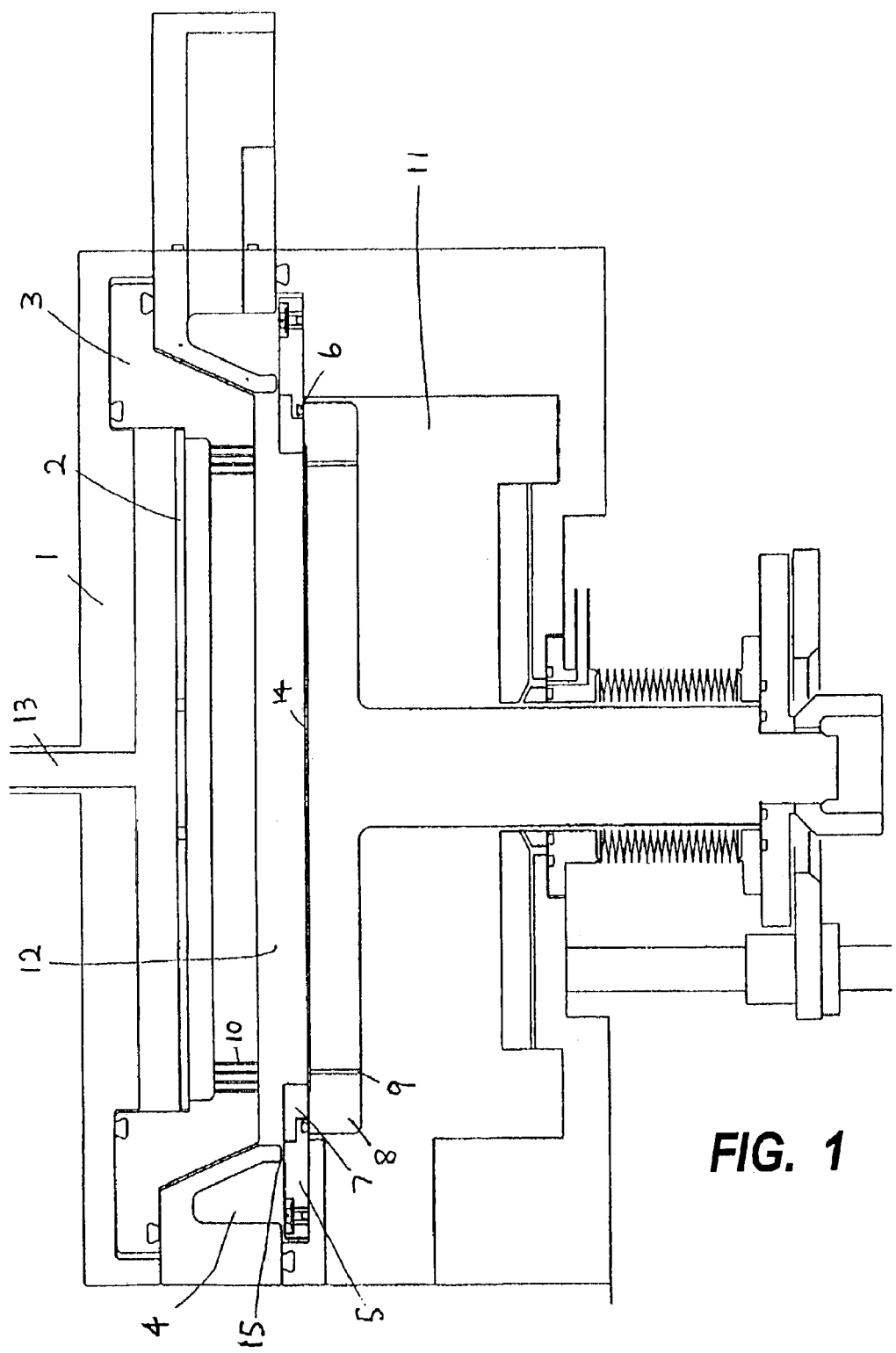
FIG. 1 is a cross sectional view of a chamber useable in the present invention.

Explanation of symbols used is as follows: 1: Upper body; 2: Dispersion plate; 3: Shower plate; 4: Exhaust duct; 5: Separation plate; 6: O-ring; 7: Guard ring; 8: Susceptor; 9: Hole (susceptor); 10: Hole (shower plate); 11: Wafer-handling chamber; 12: Reaction chamber; 13: Gas inlet port; 14: Clearance

DETAILED DESCRIPTION OF THE PREFERRED EMBODIMENT

As described in the above, in an embodiment, a single-wafer-processing type CVD apparatus forming a film on a semiconductor wafer, which is an object-to-be-processed, one wafer at a time, may comprise: a reaction chamber; a susceptor which is disposed inside the reaction chamber and is used for placing thereon the object-to-be-processed and heating the object-to-be-processed; a showerhead disposed opposed to and parallel to the susceptor, which is provided inside the reaction chamber and is used for emitting a jet of reaction gas to the object-to-be-processed; a temperature controlling mechanism which is used for regulating a temperature of the showerhead at a given temperature; an elevating means for moving the susceptor up and down; an exhaust duct means which is positioned in the vicinity of the showerhead and is provided circularly along the inner walls of the reactor; a circular separation plate coaxial with the exhaust duct means, which is disposed to form a slight clearance with the bottom of the exhaust duct means and to form a slight clearance with the susceptor, and which is a means of completely separating the reaction chamber and the wafer-handling chamber with the lower portion sealing up the periphery of the susceptor by a sealing means (e.g. an O-ring) when the susceptor rises by the susceptor elevating means.

A single-wafer-processing type CVD apparatus according to another embodiment of the present invention, which forms a film on a semiconductor wafer, an object-to-be-processed, one wafer at a time, may comprise: a reaction chamber; a susceptor which is disposed inside the reaction chamber and is used for placing thereon the object-to-be-processed and heating the object-to-be-processed; a showerhead disposed opposed to and parallel to the susceptor, which is provided inside the reaction chamber and is used for emitting a jet of reaction gas to the object-to-be-processed; a temperature controlling mechanism which is used for regulating a temperature of the showerhead at a given temperature; an elevating means for moving the susceptor up and down; an exhaust duct means which is positioned in the vicinity of the showerhead and is provided circularly along the inner walls of the reactor; and a circular separation plate coaxial with the exhaust duct means, which is disposed to form a slight clearance with the bottom of the exhaust duct means and to form a slight clearance with the susceptor, which is a means of completely separating the reaction chamber and the wafer-handling chamber with the lower portion sealing up the periphery of the susceptor by an O-ring means when the susceptor rises by the susceptor elevating means; a means bringing inert gas into the wafer-handling chamber, which feeds an inert gas from the back side of the object-to-be-processed in a direction from the wafer-handling chamber to the reaction chamber during deposition through a clearance between the separation plate and the circular guard ring disposed in such a way that the guard ring completely covers a given area of the periphery of the object-to-be-processed along the inner circumference of the circular separation plate coaxial with the exhaust duct means, which is disposed to form a slight clearance with the exhaust duct bottom.

A material used for the guard ring can be the same or a different material used for the separation plate and is not particularly limited. For example, a Cu-coated metal material (aluminum alloy, etc.) or ceramic (alumina, etc.) can be used for the separation plate and the guard ring. Additionally, the above-mentioned materials are used for the separation plate and heat-resistant resins such as polyimide materials and polytetrafluoroethylene (PTFE; Product name: Teflon) can be used for the guard ring. Either of insulative or conductive materials can be used for the guard ring.

Preferably, a given temperature of the showerhead may be within the range of about 50° C. to about 400° C. (including 80° C., 100° C., 200° C., 300° C., and a range including any of the foregoing). Additionally, a slight clearance between the exhaust duct bottom and the separation plate and a slight clearance between the separation plate and the susceptor may be within the range of about 0.1 mm to about 5 mm (including 0.2 mm, 0.3 mm, 0.4 mm, 0.5 mm, 0.7 mm, 1.0 mm, 1.5 mm, 2.0 mm, 3 mm, 4 mm, and a range including any of the foregoing; preferably within the range of about 0.2 mm to about 4 mm; further preferably within the range of about 0.5 mm to about 2 mm). These clearances can be changed by changing the thickness of the separation plate. A setup position of the separation plate can be adjusted as well. Additionally, although a non-deposition area of the object-to-be-processed differs depending on the type of specific processing, in the above, the size of an object-to-be-processed (a wafer) (normally, of a diameter of approximately 200–300 mm), and its use, the area may be a circular area from the periphery of the object-to-be-processed to about 0.2 mm to about 10 mm inward (including 0.5 mm, 1.0 mm, 1.5 mm, 2.0 mm, 2.5 mm, 5 mm, and a range including any of the foregoing; preferably within the range of about 0.5 mm to about 3 mm). A circular guard ring may be disposed in such a way as to cover the area. The circular guard ring can be disposed as an extension of the separation plate, or it can be disposed separately from the separation plate, e.g. at a susceptor portion.

The apparatus may include a means for determining a pressure in the vicinity of the object-to-be-processed from a pressure measurement inside the exhaust duct by means of a calculation using a clearance between the separation plate and the susceptor and a flow rate of reaction gas as parameters.

If processing of preventing deposition at the periphery of the object-to-be-processed is not required, a circular guard ring may not be required.

Additionally, according to one embodiment of the present invention, when the wafer-handling chamber and the reaction chamber are completely separated by the separation plate, multiple gas discharge holes are arranged circularly slightly on the inside of the wafer periphery for letting inert gas flow in a direction from the wafer-handling chamber to the reaction chamber to prevent deposition, etc. on the back side of the wafer. From these holes, the gas is discharged to a portion slightly on the inside of the periphery of the back side of the wafer and flows into the reaction chamber by way of the wafer periphery. By providing multiple gas discharge holes circularly, gas flows out to the reaction chamber from the back side of the wafer through the wafer periphery, and a curtain made of a gas stream like an air curtain can be formed, making it possible to completely prevent undesired deposition on the back side, etc. of the wafer. As a result, it becomes possible to effectively prevent metal contamination.

There is no particular limitation on positions of setting up gas discharge holes as long as the holes are provided in the positions which can effectively prevent deposition onto the back side of the wafer by gas discharge. As an example, the holes can be positioned in a donut-shape area which is on the outside of about ½ of the distance between the center of the susceptor and the wafer periphery and up to about 5 mm on the inside of the wafer edge. In other words, for the apparatus for 300 mm diameter wafers, the area may be within about 75 mm to about 145 mm (including 85 mm, 95 mm, 105 mm, 115 mm, 125 mm, 135 mm, and a range including any of the foregoing) from the center point of the susceptor; for the apparatus for 200 mm diameter wafers, the area may be within about 50 mm to about 95 mm (including 55 mm, 60 mm, 65 mm, 70 mm, 75 mm, 80 mm, 85 mm, 90 mm, and a range including any of the foregoing) from the center point of the susceptor. In an embodiment, the area may be about 0.1 mm to about 50 mm (including 0.5 mm, 1.0 mm, 5 mm, 10 mm, 20 mm, 30 mm, 40 mm, and a range including any of the foregoing) on the inside of the wafer periphery (preferably, about 2 mm to about 20 mm). There is no limitation on the number of discharge holes. Approximately one to 100 holes (including 2, 3, 4, 5, 6, 7, 8, 9, 10, 20, 30, 40, 50, 60, 70, 80, 90, and a range including any of the foregoing) can be provided (in one embodiment, the number of holes may be approximately 3 to 10). The arrangement of holes may be equally and concentrically with the center of the susceptor. Circular arrangement is preferable. Not limiting to one row, multiple rows can be provided. The diameter of the gas discharge hole also is not particularly limited; and it may be, for example, about 0.2 mm to about 5 mm (including 0.5 mm, 1.0 mm, 1.5 mm, 2.0 mm, 3 mm, 4 mm, and a range including any of the foregoing) According to one embodiment, the diameter may be about 0.5 mm to about 1.5 mm. Regarding a shape of the hole, a section in a circular form may be typical. Not limiting to a circular shape, it can be formed like a slit. In the case of a slit shape, its width may be a length of approximately the above-mentioned diameter and its length may not be particularly limited. If it is possible from the susceptor construction viewpoint, for example, one slit can be formed to go half around or to go around by a quarter of the circumference (including 1/16, 1/8, 1/4, 1/3, 1/2, 1/1 of the circumference of the susceptor at a given distance from the center, an a range including any of the foregoing, and any combination of the foregoing).

The construction including gas discharge holes differs depending on the process involved; the diameter of a gas discharge hole, the number of the holes, their positions, etc. can be designed accordingly. For example, if a process uses a high pressure inside the reaction chamber, a flow rate of gas supplied from the lower portion of the susceptor needs to be increased, hence the diameter of a hole is enlarged and the number of holes is increased.

Using wafer lift pin holes provided in the susceptor as gas discharge holes can achieve gas discharge easily (In this case, the number of gas discharge holes is changed according to the number of lift pins. There are some cases in which the number of holes is three.). In the case in which a pressure inside the reaction chamber is high, as describe in the above, gas discharge holes can be provided in addition to lift pins, or holes exclusively used for gas discharge can be provided separately. As long as it is possible to disposed in such a way that gas flows out to the reaction chamber from the back side of the wafer via the wafer periphery, one gas discharge hole can be provided in the center or one hole in the center surrounded by several holes circularly can be provided.

The gas discharge holes can be provided in an embodiment not comprising a circular guard ring. If the holes are used along with the circular guard ring, because the guard ring covers the wafer periphery, the positions of holes are not limited by the above-mentioned structures. For example, the holes can be provided in an area on the outside of the wafer placed on the susceptor (e.g. approximately 0 mm to 5 mm outside from the periphery, including 0.1 mm, 0.5 mm, 1 mm, 2 mm, 3 mm, 4 mm, 10 mm, and a range including any of the foregoing). In this case, because gas flows out into the reaction chamber through a clearance between the guard ring and the wafer, unnecessary deposition onto the back side of the wafer, etc. can be prevented.

Gas types are not particularly limited; Ar, He, Kr, Ne, $N_2$, etc. which are inert gases can be used extensively. An amount of gas discharge is not particularly limited if the amount can prevent unnecessary deposition. For example, an amount may be about 1 sccm to about 2000 sccm (including 5 sccm, 10 sccm, 50 sccm, 100 sccm, 500 sccm, 1000 sccm, 1500 sccm, and a range including any of the foregoing). According to one embodiment, an amount is about 50 sccm to about 500 sccm). Gas can be brought in continuously during deposition, or can be brought in intermittently. Gas can be brought in not only during deposition, but also before and after deposition.

Regarding other structures and requirements, etc. in the present invention, those disclosed in Japanese Patent Application 2001-361669 (Filing date: Nov. 27, 2001), Japanese Patent Application 2000-251455 (Filing date: Aug. 22, 2000) and commonly assigned U.S. patent application Ser. No. 09/932,790 (Filing date: Aug. 17, 2001) are applicable. These applications are herein incorporated by reference in their entirety.

Figure 5:
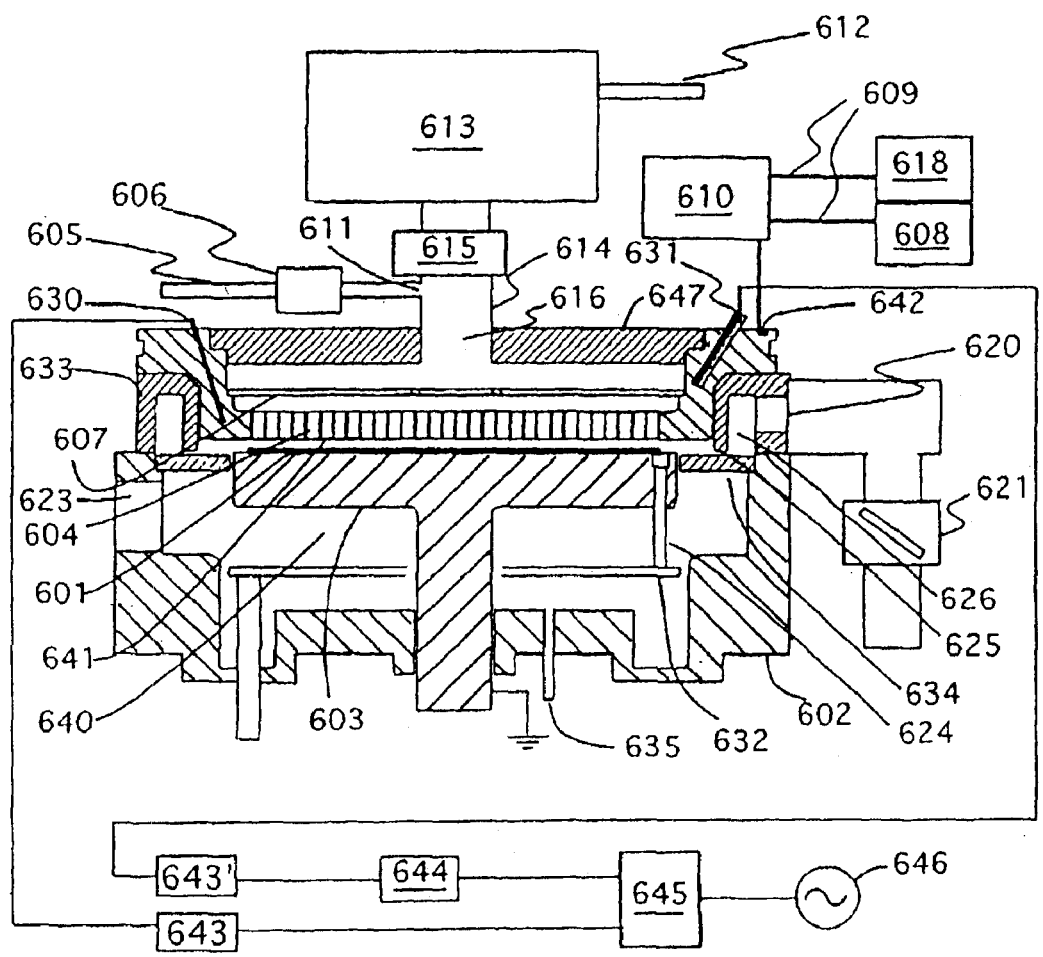
FIG. 5 is FIG. 6 of Japanese Patent Application 2001-361669 (Filing date: Nov. 27, 2001).

For example, the construction of this application can be incorporated in the apparatus shown in FIG. 6 of Japanese Patent Application 2001-361669 (Filing date: Nov. 27, 2001). FIG. 6 of the Application is included in the present application for reference wherein that figure is referred to as FIG. 5. FIG. 5 shows an embodiment of a parallel plate type of plasma CVD apparatus which performs self-cleaning. This apparatus is a parallel plate type of plasma CVD apparatus for 300 mm wafer processing, which performs remote plasma cleaning.

Inside a reactor, a susceptor 603 for placing an object-to-be-processed 601 such as a glass or silicon wafer on it is disposed. The susceptor 603 comprises preferably ceramic or aluminum alloy, inside which a resistance-heating type heater is laid. The susceptor 603 is also used as a lower electrode for generating a plasma. In this embodiment, the diameter of the susceptor 603 is 325 mm and the area of the susceptor is 1.17 times larger than the area of the object-to-be-processed 601 with a diameter of 300 mm. As long as the area of a susceptor is larger than the area of an object-to-be-processed within the range of about 1.08 to about 1.38 times (including 1.1 times, 1.2 times, and 1.3 times, but in some case, 1.5 times, and a range including any of the foregoing), susceptors with different diameters can be also used. A showerhead 604 for emitting a jet of reaction gas equally to the object-to-be-processed 601 is disposed on the ceiling of the reactor, parallel and opposed to the susceptor. The showerhead 604 is also used as an upper electrode for generating a plasma. In this embodiment, the diameter of the showerhead is 380 mm and the area of a showerhead is 1.37 times larger than the area of the susceptor 603. As long as a showerhead area is larger than an area of a susceptor within the range of 1.05 to 1.44 times (including 1.1 times, 1.2 times, 1.3 times, and 1.4 times, but in some case, 1.5 times, and a range including any of the foregoing), showerheads with different diameters can be used.

On the top of a showerhead 604, an alumina top plate 647 is provided. The showerhead 604 is supported by an alumina duct means 633 disposed circularly along the inner wall surfaces of the reactor. A circular alumina separation plate 634 is disposed coaxially with the duct means 633 in such a way that a slight clearance is formed with the bottom of the duct means, and a slight clearance is formed with the susceptor during deposition. By the separation plate 634, the reactor is practically separated into a reaction chamber and a WHC (Wafer Handling Chamber). As described above, by using an insulating material for all components adjacent to the showerhead 604 inside the reactor, generating a plasma between the showerhead 604 and the reaction chamber inner walls can be prevented. As an insulating material for the above-mentioned top plate 647, the duct means 633 and the separation plate 634, using ceramics, which satisfy requirements including insulation, heat resistance, corrosion resistance, plasma resistance, and low dust generation, are effective. Other than alumina, aluminum nitride (AlN) or magnesia (MgO) can be also used.

Between the separation plate 634 and the duct means 633, an exhaust gap 625 is formed. On the side wall of the duct means 633, an exhaust port 620 is provided. The exhaust port is connected to a vacuum pump (not shown) via a conductance regulating valve 621. On the side wall 602 of the WHC made of aluminum alloy, an opening 623 for bringing/carrying an object-to-be-processed 601 into/out from the WHC is provided. Additionally, on a portion of the side wall 602, an inert gas inlet 635 coupled with a means for bringing in an inert gas (not shown) is provided. The inert gas (preferably Ar or He) brought in from the inert gas inlet 635 flows from the WHC to the reaction chamber side through a clearance formed between the separation plate 634 and the susceptor 603. By this purging by the inert gas, migration of reaction gas or plasma toward the underneath of the susceptor 603 can be prevented. The side wall 602, the duct means 633, the showerhead 604 and the top plate 647 are sealed by a sealing means such as an O-ring and are completely separated from the atmosphere. Underneath the susceptor 603, a wafer-lifting mechanism 632 is provided and supports multiple alumina wafer lift pins 624. The wafer lift pins 624 pass through the susceptor 603 and hold the edge of the object-to-be-processed 601. Mechanically coordinated with an elevating mechanism (not shown) provided outside the reactor, the susceptor and the wafer-lifting mechanism move up and down relatively to each other to place a semiconductor wafer 601 on the susceptor 603 or support the wafer in air.

Outside the reactor, a remote plasma discharge device 613 is disposed, which is coupled with an opening 616 of the showerhead 604 via a valve 615 through piping 614. A cleaning gas source (not shown) is connected to the remote plasma discharge device 613 through piping 612. One end of the piping 605 is connected to an opening 611 of the piping 614 via a valve 606. The other end of the piping 605 is connected to a reaction gas source (not shown). Radio-frequency power sources (608, 618) for generating a plasma is connected to the top 642 of the showerhead 604 via a matching circuit 610 through an output cable 609. In this embodiment, the susceptor 603 is grounded. The radio-frequency (RF) power sources (608, 618) can supply radio-frequency power of hundreds of kHz to tens of MHz (e.g., 200 kHz to 40 MHz). Preferably, to improve film quality controllability, frequencies of the radio-frequency power sources (608, 618) differ. For example, low-frequency RF power of less than 2 MHz and high-frequency RF power of at least 2 MHz may be overlaid.

This embodiment has a temperature controlling mechanism for regulating a temperature of the surface of the showerhead (upper electrode) 604. The temperature controlling mechanism comprises: a sheath heater 631 for heating the showerhead 604, which is laid inside the showerhead 604; a thermocouple 630 for measuring a temperature of the showerhead 604; bandpass filters (643, 643') for avoiding the affect of radio-frequency power connected to the sheath heater 631 and the thermocouple 630 during the deposition; a solid state relay (or a thyristor) 644 for controlling power, which is connected to the bandpass filter 643'; a temperature regulator 645, which is connected to the sheath heater 631 via the bandpass filter 643' and the solid state relay 644 and to the thermocouple 630 via the bandpass filter 643 respectively; an AC power source 646 connected to the temperature regulator 645. When the effect of radio-frequency noise is not high, the bandpass filters (643, 643') may not be required.

The object-to-be-processed 601, which is a Ø300 mm glass or silicon wafer loaded on a vacuum handling robot (not shown) in a vacuum load-lock chamber, is carried inside a WHC 640 from the opening 623 of the reactor wall 602. At this time, both the susceptor 603 disposed in the WHC 640 and multiple wafer lift pins 624 disposed on the wafer-lifting mechanism 632 come down at a low position relatively to the wafer by the elevating mechanism (not shown) such as a motor disposed outside the reactor. Multiple lift pins 624 go up relatively from the surface of the susceptor 603 and hold near the edge of the wafer. After that, while placing the wafer 601 on its surface, the susceptor 603 goes up together with the wafer-lifting mechanism 632 up to a position at which a distance between the electrodes, which was predetermined based on the deposition conditions, is achieved. After being controlled at a given flow rate by a mass flow controller (not shown), a reaction gas for forming a film on the surface of the object-to-be-processed 601 is equally brought into a reaction area 641 from the piping 605, and then passing through the valve 606, the piping 614, the opening 616 of the top plate 647, a gas dispersion plate 607, and multiple gas exhaust-nozzles provided in the showerhead 604.

The reaction gas brought in the reaction area 641 is pressure-controlled and is excited into a plasma by radio-frequency power of hundreds of kHz to tens of MHz supplied by the radio-frequency power sources (608, 618). A chemical reaction occurs on the surface of the object-to-be-processed 601 and a desired film is formed. During deposition, inert gas such as Ar or $N_2$ is brought into the WHC 640 from the inert gas inlet 635. With this, a pressure inside the WHC 640 is changed to positive pressure from the reaction area 641, and flowing of the reaction gas into the WHC is prevented. As a result, the reaction gas can be used efficiently for deposition purposes as well as for averting adhering of unnecessary deposits onto the inner walls of the WHC 640. A flow rate of the inert gas is controlled appropriately according to the reaction gas flow rate or the pressure inside the reaction chamber.

After deposition processing is completed, the reaction gas and by-products remaining in the reaction area are exhausted outside from an exhaust gap 625 through a gas path 626 inside the duct 633, then from the exhaust port 620. When the deposition processing is completed, the susceptor 603 and the wafer-lifting mechanism 632 come down at a wafer handling position. As the susceptor comes down further from that position, the wafer lift pins 624 project above the surface of the susceptor 603 relatively to the position of the susceptor and hold the object-to-be-processed (semiconductor wafer) 601 in air. After that, the semiconductor wafer 601 is carried out outside a load-lock chamber (not shown) by a handling means (not shown) through the opening 623.

After deposition of one to multiple wafers is completed, self-cleaning for cleaning deposits adhering to portions exposed to the reaction gases inside the reaction area 641 is performed. After a flow rate of cleaning gas (for example, $C_2F_6+O_2$, $NF_3+Ar$, $F_2+Ar$, etc.) is controlled at a given flow rate, the cleaning gas is brought into the remote plasma discharge device 613 through the piping 612. The cleaning gas activated by the remote plasma discharge device 613 is brought into the opening 616 of the top plate 647 of the reactor through the piping 614 via the valve 615. The cleaning gas brought into the reactor from the opening 616 is equally dispersed to the reaction area 641 via the gas dispersion plate 607 and multiple gas exhaust-nozzles provided in the showerhead 604. The cleaning gas introduced chemically reacts with the deposits adhering to the inner walls of the reaction chamber in the reaction area 641 and gasifies the deposits. Gasified deposits are exhausted outside from the exhaust gap 625 through the gas path 626 inside the duct 633, then from the exhaust port 620.

The method of improving cleaning efficiency according to an embodiment of the present invention is described below, but the present invention is not limited thereto. In this embodiment, the method includes: a process of selecting a susceptor in such a way that a value obtained by dividing "a surface area of the susceptor" by "a surface area of the object-to-be-processed" is within the range of about 1.08 to about 1.38; a process of selecting a showerhead in such a way that a value obtained by dividing "a surface area of the showerhead" by "a surface area of the susceptor" is within the range of about 1.05 to about 1.44; a process of controlling a temperature of the showerhead within the range of about 200° C. to about 400° C. As to the process of limiting a ratio of the susceptor surface area to the area of the wafer within the range of 1.08 to 1.38, specifically it is possible to limit a real area by controlling plasma generation by covering an extra susceptor area by a circular insulator plate in addition to changing a measurement of the susceptor. The process of controlling a temperature of the showerhead within the range of about 200° C. to about 400° C., is in this embodiment to supply power to multiple sheath heaters 631 so that the temperature of the temperature regulator 645 is changed to a given temperature by responding to signals sent from the thermocouple 630. The thermocouple 630 sends the signals to the temperature regulator 645 via the bandpass filter 643 to avoid the effect of radio-frequency power during deposition. Responding to the signals, the temperature regulator 645 feeds power to multiple sheath heaters 631 via the solid state relay 644 for regulating power and the bandpass filter 643 for avoiding the effect of radio-frequency power during deposition.

Furthermore, in an embodiment, the method includes a process of optimizing self-cleaning frequencies. The process specifically comprises a process of obtaining a ceiling value of cumulative film thickness with which continuous processing is possible at each temperature of the showerhead, which is controlled at 200° C. to 400° C., and a process of obtaining the maximum cleaning cycle by dividing the ceiling value by a film thickness to be deposited on an object-to-be-processed. In this embodiment, the process of obtaining a ceiling value of cumulative film thickness with which continuous processing is possible at each temperature of the showerhead which is controlled at 200° C. to 400° C. is specifically to check the maximum number of wafers processed by performing deposition processing continuously without performing cleaning until unwanted films start to exfoliate from the showerhead surface and dust generation is observed. For example, when a plasma silicon oxide film of 0.5 $\mu$m in thickness is deposited as in the above-mentioned experiment, cumulative film thickness with which continuous processing is possible is calculated as follows:

Continuously processible cumulative film thickness ($\mu$m)=0.5 ($\mu$m)×{Maximum No. of wafers processed}

The single-wafer-processing type CVD apparatus forming a film on a semiconductor wafer, which is an object-to-be-processed, one wafer at a time, according to an embodiment of the present invention, is described by referring to figures but is not limited thereto.

Figure 2:
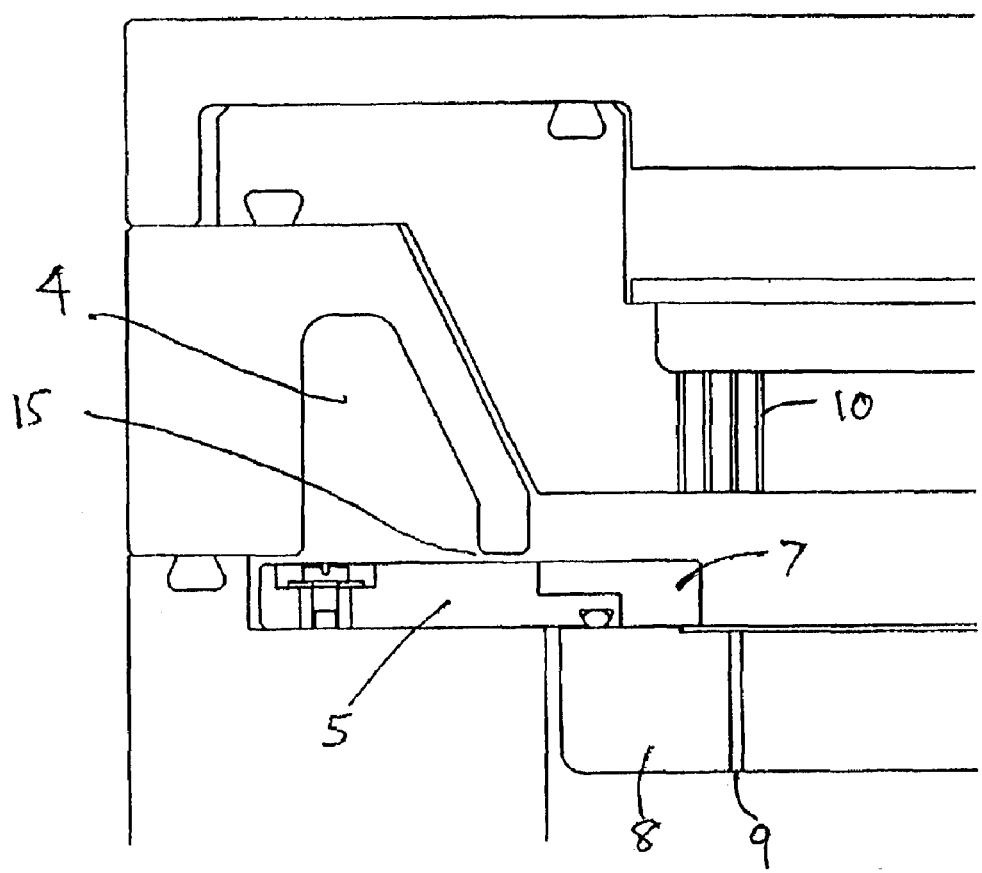
FIG. 2 is a partially enlarged view of FIG. 1.

FIG. 1 is a cross sectional view of a chamber. FIG. 2 is a detailed view of the inside of the chamber.

Figure 3:
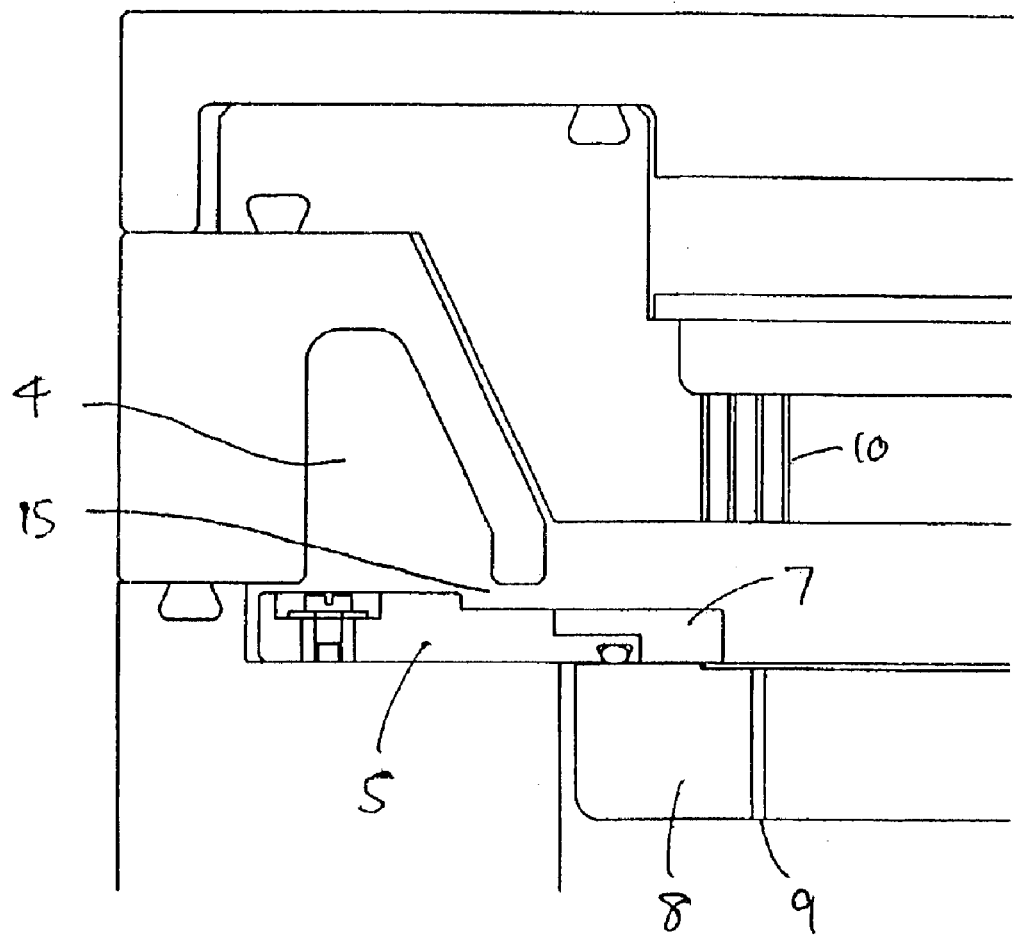
FIG. 3 is a view showing a change of the exhaustion clearance by changing the shape of a separation plate in an embodiment of the present invention.
Figure 4:
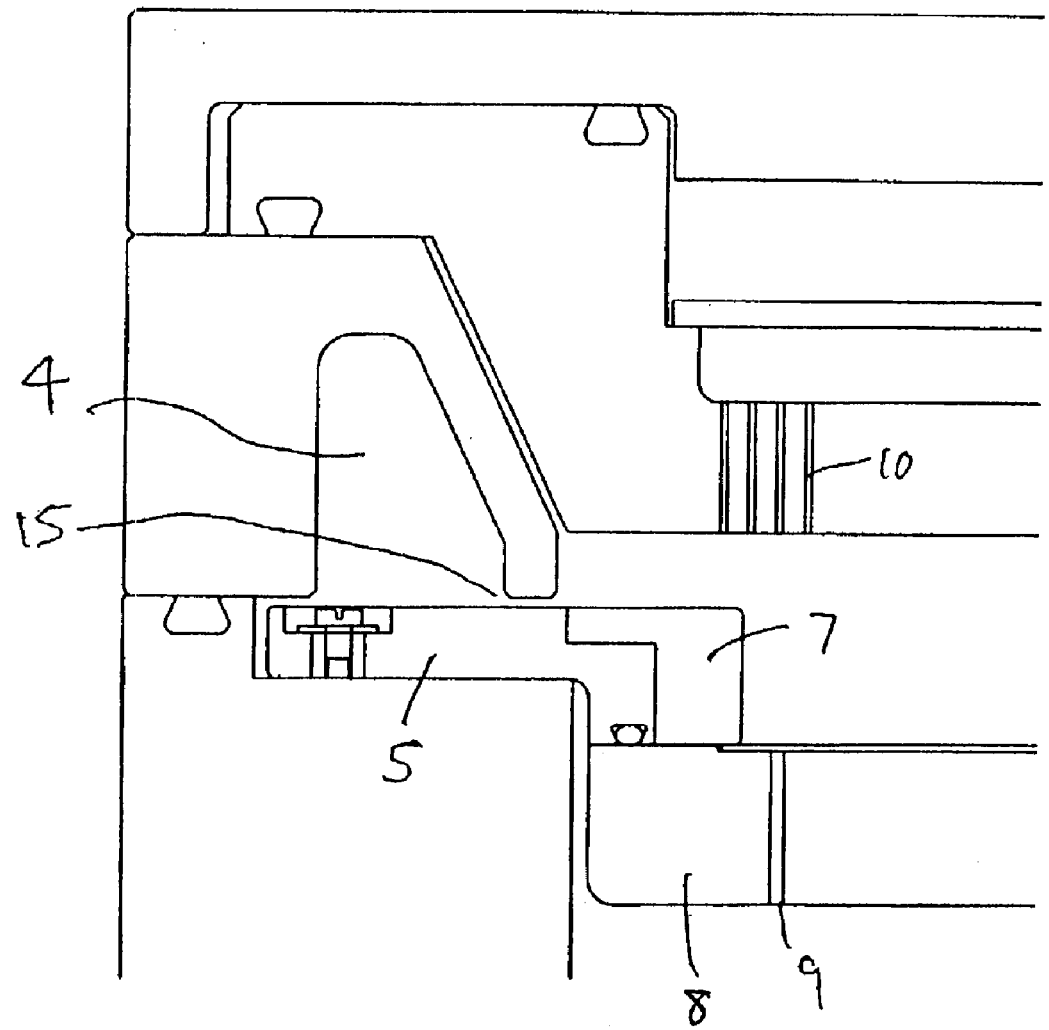
FIG. 4 is a view showing a change of the gap of the reaction chamber by changing shapes of a separation plate and a guard ring in an embodiment of the present invention.

After a semiconductor wafer, which is an object-to-be-processed, is transferred from a vacuum transfer chamber (not shown) connected to the chamber to a susceptor 8, the susceptor is raised by a susceptor elevating means (not shown), and a reaction chamber 12 and a wafer-handling chamber 11 are completely separated by a susceptor periphery and an O-ring 6 provided at the lower portion of a separation plate 5. In this position, a given area of the wafer periphery is covered by a guard ring 7. A given area is determined to be within about 0.5 mm to about 3 mm in view of contact portions of an apparatus used in a post-process. FIG. 1 shows a position in which the susceptor is raised and the reaction chamber and the wafer-handling chamber are separated. A process flow of deposition is as follows: Reaction gas is supplied from a gas inlet port 13 provided at an upper body 1, the reaction gas evenly dispersed by a gas dispersion plate 2 and is emitted to a semiconductor wafer from a number of holes 10 made in a showerhead 3. The reaction gas is exhausted passing through a clearance 15 between an exhaust duct and the separation plate. The showerhead is controlled at a given temperature by a heating and a cooling means (not shown but similar to those shown in FIG. 5). The given temperature is determined appropriately according to a reaction gas used. The given temperature is preferably within about 50° C. to about 400° C. It is necessary that the temperature may be below decomposition temperature particularly owing to physical properties of organic metal complexes often used for metal film deposition and at the same time the temperature may be above a temperature at which the complexes do not condense by a deposition reaction pressure. The semiconductor wafer is heated to a given temperature by the susceptor, and a metal film is formed. At this time, an inert gas supplied to the wafer-handling chamber is exhausted from holes 9 provided in the susceptor passing through a clearance between the semiconductor wafer and the susceptor, a clearance of the guard ring and the exhaust duct 4, preventing deposition of a metal film on the back side and a given area from the edge of the wafer. A given susceptor temperature depends on a reaction gas used, but is preferably about 80° C. to about 600° C. (in other embodiments, about 100° C. to about 400° C.). A distance between the susceptor in the reaction chamber and a semiconductor wafer and a distance of the clearance 15 for gas exhaustion can be changed easily by changing the thickness of the separation plate (FIG. 3 and FIG. 4). The distance between the susceptor and the shower plate is preferably within the range of about 10 mm to about 40 mm (including 20 mm, 30 mm, and a range including he foregoing). A distance of the clearance 15 for reaction gas exhaustion is preferably within the range of about 0.2 mm to about 4 mm.

As to a pressure (P1) during a deposition reaction, the reaction pressure in the vicinity of the semiconductor wafer is calculated using the formula described below, in which a pressure (P2) inside the exhaust duct is measured, conductance (C) is calculated using the clearance 15 as a parameter, and Q is calculated using a flow rate of reaction gas as a parameter and is controlled using an APC (an automatic pressure controller, not shown).

$$P1=Q/(C(1-P2/P1)$$

As described in the above, by arranging only the showerhead and the susceptor controlled at given temperatures and the guard ring inside the reaction chamber, minimizing deposition onto an area other than the semiconductor wafer becomes possible. At regular maintenance work, it becomes possible to restore the apparatus only by replacing a guard ring. In an embodiment, showerhead replacement and duct cleaning, which are necessary at maintenance work after the apparatus is used for long hours, can be done easily with the chamber construction according to the present invention.

Embodiment

An embodiment of the present invention is described using Cu film deposition using the reactor shown in FIG. 1 as an example. After a semiconductor wafer is transferred from an evacuated load-lock chamber (not shown) to a susceptor 8, the susceptor is raised to a reaction position by a susceptor elevating means. At this time, the periphery of the susceptor is sealed by an O-ring provided at the lower portion of a separation plate 5, and the wafer-handling chamber 11, and the reaction chamber 12 are completely separated. At this time, the periphery of the wafer of 2 mm is completely covered by the guard ring 7. By supplying Ar from the wafer-handling chamber through holes 9 provided in the susceptor, deposition onto the back side and the edge of the wafer is prevented. After the susceptor is raised into the reaction chamber, 1000 sccm of inert gas is brought in from a gas inlet port 13. While the inert gas is emitted onto the wafer from holes 10 provided in the showerhead 3 a temperature of which is controlled at 80° C., the wafer is heated to 150° C. The pressure at this time is also controlled by the APC (not shown) at 3 Torr which is the same as applied during deposition. After the temperature of the wafer is raised for approximately 120 sec., the feeding of the inert gas is stopped, and gasified Cu source (CupraSelect™, produced by Schumacher Co.) by a vaporizer (not shown) is brought in the reaction reactor by switching over from feeding a carrier gas Ar. The Cu source brought in is emitted onto the wafer from the holes 10 in the showerhead 3 by equally being dispersed by a dispersion plate 2. The Cu source emitted onto the wafer is exhausted through a clearance of 0.5 mm formed concentrically between the exhaust duct and the separation plate 5. At this time, from a pressure inside the exhaust duct (P2) measured and C and Q calculated using set conductance and a gas flow rate as parameters, the pressure in the vicinity of the wafer (P1) is calculated by the formula described below and is controlled at 3 Torr by the APC (not shown): $P1=Q/(C(1-P2/P1)$ Supplying Cu source is stopped after deposition continues for one minute; inside the reaction chamber is evacuated; the susceptor is lowered up to a transfer position. After that, the wafer deposited is carried out to the evacuated load-lock chamber. Regarding wafers deposited in this way, no Cu deposition on the back side and the edge of the wafers is observed. Consequently, without performing special cleaning in a post-process, there is no possibility of metal contamination. Additionally, in the deposition according to the present invention, deposition on areas other than wafers was hardly observed, which tells that a maintenance cycle is long. Because a guard ring on which slight deposition was observed except the wafer can be replaced easily at maintenance, which tells that down time relating to maintenance is short.

Effects

As described in the above, special cleaning in a post-process for preventing contamination becomes unnecessary by an embodiment of the present invention. Because unnecessary deposition inside the chamber does not occur, down time relating to maintenance is reduced and at the same time providing a stable deposition process apparatus becomes possible. Furthermore, in the apparatus according to an embodiment of the present invention, because the temperature of a showerhead and the temperature of a susceptor can be changed widely, there will be no need for a new apparatus when new materials with different physical properties, which will become necessary in the future, are used, and a cost reduction becomes possible.

As mentioned before, the entire disclosure of Japanese Patent Application 2001-361669 (Filing date: Nov. 27, 2001), etc. is herein incorporated by reference. For example, Japanese Patent Application 2001-361669 (Filing date: Nov. 27, 2001) discloses the following contents, which are also applicable to this application as necessary:

1) A plasma CVD apparatus performing self-cleaning, which comprises a reaction chamber, a susceptor disposed inside the reaction chamber, which is used for placing thereon an object-to-be-processed and heating the object-to-be-processed and serves as one of the electrodes for generating a plasma, a showerhead disposed opposed to and parallel to the susceptor, which is used for emitting a jet of reaction gas onto the object-to-be-processed and serves as the other electrode for generating a plasma, a temperature controlling mechanism for regulating a temperature of the showerhead at a given temperature, a remote plasma discharge device provided outside the reaction chamber, which is used for activating cleaning gas remotely, and a radio-frequency power supplying means which is electrically connected to either of the susceptor or the showerhead.

2) A plasma CVD apparatus performing self-cleaning, which comprises a reactor, a susceptor disposed inside the reactor, which is used for placing thereon an object-to-be-processed and heating the object-to-be-processed and serves as one of the electrodes for generating plasma, an elevating means for moving the susceptor up and down, a showerhead provided on the ceiling of the reactor and disposed opposed to and parallel to the susceptor, which is used for emitting a jet of reaction gas to the object-to-be-processed and serves as the other electrode for generating plasma, a duct means supporting the showerhead and positioned in the vicinity of the showerhead for supporting, which comprises an insulator provided circularly along the inner walls of the reactor, an insulator separation plate coaxial with the duct means, which is disposed to form a slight clearance with the bottom of the duct means and a slight clearance with the susceptor during deposition and which practically separates the reactor into a reaction chamber and a wafer-handling chamber (WHC), a means for bringing inactive gas into the wafer-handling chamber (WHC), which is also used as a means for letting the inactive gas flow in a direction from the WHC to the reaction chamber through the clearance formed between the insulator separation plate and the susceptor during deposition, a temperature controlling mechanism for regulating a temperature of the showerhead at a given temperature, a remote plasma discharge device disposed outside the reactor, which is used for activating cleaning gas remotely, and a radio-frequency power supplying means electrically connected to either of the susceptor or the showerhead.

3) The plasma CVD apparatus as described in 1) or 2) above, wherein a given temperature is within the range of 200° C. to 400° C.

4) The plasma CVD apparatus as described in 1) or 2) above, wherein the temperature controlling mechanism comprises one or more heating means, which are arranged adjacently to the showerhead, a temperature measuring means, and a temperature controlling means, which is coupled to the heating means and the temperature measuring means.

5) The plasma CVD apparatus as described in 4) above, wherein the heating means is a sheath heater and the temperature means is a thermocouple.

6) The plasma CVD apparatus as described in 1) or 2) above, wherein a value obtained by dividing 'a surface area of the susceptor' by 'a surface area of the object-to-be-processed' is within the range of 1.08 to 1.38.

7) The plasma CVD apparatus as described in 1) or 2) above, wherein a value obtained by dividing 'a surface area of the showerhead' by 'a surface area of the susceptor' is within the range of 1.05 to 1.44.

8) A method for performing self-cleaning efficiently using the plasma CVD apparatus as described in 1) above, which comprises a process for selecting a susceptor in such a way that a value obtained by dividing 'a surface area of the susceptor' by 'a surface area of the object-to-be-processed' is within the range of 1.08 to 1.38, a process for selecting a showerhead in such a way that a value obtained by dividing 'a surface area of the showerhead' by 'a surface area of said susceptor' is within the range of 1.05 to 1.44, a process for controlling a temperature of the showerhead within the range of 200° C. to 400° C., a process for activating cleaning gas using the remote plasma discharge device and bringing active cleaning species into the reaction chamber, a process for generating plasma in a reaction area between the susceptor and the showerhead, and a process for controlling pressure inside the reaction chamber.

9) The method as described in 8) above, which further comprises a process for optimizing self-cleaning frequencies.

10) The method as described in 9) above, wherein the process for optimizing frequencies of self-cleaning comprises a process for obtaining a ceiling value of cumulative film thickness with which continuous processing is possible, and a process for obtaining the maximum cleaning cycle by dividing the ceiling value by a film thickness to be deposited on an object-to-be-processed.

The present invention is not limited by the forms shown in FIGS. 1 to 5, can be changed.

What is claimed is:

1. A method of film deposition comprising the steps of:
   placing a wafer on a susceptor positioned inside a wafer-handling chamber disposed under a reaction chamber included in a single-wafer-processing type CVD apparatus;
   positioning the wafer inside the reaction chamber by raising the susceptor;
   when the susceptor moves to the position, separating the reaction chamber and the wafer-handling chamber by making closely in contact a periphery of the susceptor and a circular separation plate disposed coaxially with the susceptor and between the reaction chamber and the wafer-handling chamber;
   emitting a jet of reaction gas from a showerhead disposed inside the reaction chamber onto the wafer to be processed;
   depositing a film on the wafer;
   during the deposition, discharging an inert gas from the wafer-handling chamber to the reaction chamber through at least one gas discharge hole formed through the susceptor from its bottom to its top, and via a back side of the wafer placed on the susceptor and a periphery of the wafer;
   evacuating the reaction chamber through an exhaust duct, which is positioned in the vicinity of the showerhead and is provided circularly along an inner wall of the reaction chamber; and
   after the deposition, lowering the susceptor and moving the wafer to the wafer-handling chamber.

2. The method as claimed in claim 1, further comprising covering a non-deposition area of a periphery of the wafer by a circular guard ring during the deposition.

3. The method as claimed in claim 2, wherein the circular guard ring is provided at an inner circumference portion of the separation plate, and the inert gas is discharged into the reaction chamber via the back side of the wafer, the wafer periphery, and a clearance formed between the circular guard ring and the wafer.

4. The method as claimed in claim 1, wherein the susceptor comprises multiple wafer lift pins which are used as said at least one gas discharge hole.

5. The method as claimed in claim 2, wherein the inner circumference portion of the guard ring contacts the wafer periphery when the reaction chamber and the wafer-handling chamber are separated after the susceptor goes up and the wafer is positioned inside the reaction chamber.

6. The method as claimed in claim 1, wherein the evacuation of the reaction chamber is performed through a clearance formed between the circular exhaust duct and the separation plate.

7. The method as claimed in claim 6, wherein said clearance is adjustable within the range of 0.1 mm to 5 mm by changing a thickness of the separation plate.

8. The method as claimed in claim 1, wherein the deposition is performed at a temperature in the range of 50° C. to 400° C.

9. The method as claimed in claim 1, wherein a pressure during the deposition is determined by calculating a pressure inside the circular exhaust duct by using as parameters a clearance between the separation plate and the susceptor and a flow rate of the reaction gas.

10. A method of film deposition comprising the steps of:
    placing a wafer on a susceptor positioned inside a wafer-handling chamber disposed under a reaction chamber included in a single-wafer-processing type CVD apparatus;
    positioning the wafer inside the reaction chamber by raising the susceptor;
    when the susceptor moves to the position, separating the reaction chamber and the wafer-handling chamber by making closely in contact a periphery of the susceptor and a circular separation plate disposed coaxially with the susceptor and between the reaction chamber and the wafer-handling chamber;
    emitting a jet of reaction gas from a showerhead disposed inside the reaction chamber onto the wafer to be processed;
    depositing a film on the wafer;
    during the deposition, discharging an inert gas from the wafer-handling chamber to the reaction chamber through at least one gas discharge hole formed through the susceptor from its bottom to its top, and via a periphery of the wafer placed on the susceptor and a inner periphery of the circular separation plate;
    evacuating the reaction chamber through an exhaust duct, which is positioned in the vicinity of the showerhead and is provided circularly along an inner wall of the reaction chamber; and
    after the deposition, lowering the susceptor and moving the wafer to the wafer-handling chamber.

11. The method as claimed in claim 10, further comprising covering a non-deposition area around the wafer periphery by a circular guard ring during the deposition, wherein the circular guard ring is provided at an inner circumference portion of the separation plate and the inert gas is discharged into the reaction chamber through the wafer periphery and a clearance formed between the circular guard ring and the wafer.

* * * * *